United States Patent
Kerrigan et al.

(10) Patent No.: US 6,956,745 B2
(45) Date of Patent: Oct. 18, 2005

(54) HANDLING SYSTEM FOR USE WITH A BLADE IN A BLADE SERVER SYSTEM

(75) Inventors: Brian Michael Kerrigan, Cary, NC (US); Gerard Francis Muenkel, Raleigh, NC (US); Charles William Piper, Burlington, NC (US); Brian Alan Trumbo, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 101 days.

(21) Appl. No.: 10/607,704

(22) Filed: Jun. 27, 2003

(65) Prior Publication Data

US 2004/0264146 A1 Dec. 30, 2004

(51) Int. Cl.[7] .................................................. H05K 5/00
(52) U.S. Cl. ....................... 361/726; 361/727; 361/732; 439/325; 439/152; 312/223.1; 312/223.2
(58) Field of Search ................................. 361/754, 755, 361/798, 683, 727–732; 439/152, 153, 155, 325, 328

(56) References Cited

U.S. PATENT DOCUMENTS

| | | | |
|---|---|---|---|
| 3,339,956 A | | 9/1967 | Bencene et al. |
| 4,925,397 A | * | 5/1990 | Mirand et al. ............... 439/353 |
| 5,556,145 A | | 9/1996 | Takasaki |
| 5,793,614 A | * | 8/1998 | Tollbom ..................... 361/732 |
| 5,928,016 A | * | 7/1999 | Anderson et al. ........... 439/159 |
| 6,669,497 B2 | * | 12/2003 | Westphall et al. .......... 439/325 |

* cited by examiner

Primary Examiner—Lynn Field
Assistant Examiner—Anthony Q. Edwards
(74) Attorney, Agent, or Firm—Sawyer Law Group LLP

(57) ABSTRACT

A handling system for use with a blade is disclosed. The blade is within a computer system. The handling system comprises a chassis for holding the blade and a first handle member coupled to the chassis. The handling system includes a second handle member coupled to the chassis and being oppositely disposed to the first handle member. Finally, the handling system includes a latching mechanism which holds the first and second handle member in a retracted position when engaged therewith. The latching member when activated causes the first and second handle members to spring out to a point where the first and second handle members can be used to remove the chassis from the computer system. A method and system in accordance with the present invention limits the handling system profile dimensionally by providing a spring-loaded latching mechanism for the handle members. In so doing, a blade server system is provided that has a smaller footprint than conventional server systems.

16 Claims, 8 Drawing Sheets

HANDLING SYSTEM FOR USE WITH A BLADE IN A BLADE SERVER SYSTEM

FIELD OF THE INVENTION

The present invention relates generally to server systems and more particularly to a handling system for use on blades within a server system.

BACKGROUND OF THE INVENTION

In today's environment, a computing system often includes several components, such as servers, hard drives, and other peripheral devices. These components are generally stored in racks. For a large company, the storage racks can number in the hundreds and occupy huge amounts of floor space. Also, because the components are generally free standing components, i.e., they are not integrated, resources such as floppy drives, keyboards and monitors, can not be shared. A system has been developed by International Business Machines Corp. of Armonk, N.Y., that bundles the computing system described above into a compact operational unit. The system is known as an IBM eServer BladeCenter.™

FIG. 1 is a front, top and right side exploded perspective view of the IBM eServer BladeCenter. Referring to this figure, main chassis CH1 houses all the components of the server blade system. Up to 14 server blades PB1 through PB14 (or other blades, such as storage blades) are hot pluggable into the 14 slots in the front of chassis CH1. The term "server blade" or simply "blade" is used throughout the specification and claims, but it should be understood that these terms are not limited to blades that only perform "processor" or "server" functions, but also include blades that perform other functions, such as storage blades, which typically include hard disk drives and whose primary function is data storage.

Server blades provide the processor, memory, hard disk storage and firmware of an industry standard server. In addition, they include keyboard, video and mouse ("KVM") selection via a control panel, an onboard service processor, and access to the floppy and CD-ROM drives in the media tray. A daughter card is connected via an onboard PCI-X interface and is used to provide additional high-speed links to switch modules SM3 and SM4 (described below). Each server blade also has a front panel with 5 LEDs to indicate current status, plus four push-button switches for power on/off, selection of server blade, reset, and NMI for core dumps for local control.

Blades may be "hot swapped" without affecting the operation of other blades in the system. A server blade is typically implemented as a single slot card (394.2 mm×226.99 mm); however, in some cases a single server blade may require two slots. A server blade can use any microprocessor technology as long as it compliant with the mechanical and electrical interfaces, and the power and cooling requirements of the server blade system. For redundancy, server blades have two signal and power connectors; one connected to the upper connector of the corresponding slot of midplane MP (described below), and the other connected to the corresponding lower connector of the midplane. Server blades interface with other components in the server blade system via the following midplane interfaces: 1) Gigabit Ethernet (2 per blade; required); 2) Fibre Channel (2 per blade; optional); 3) management module serial link; 4) VGA analog video link; 4) keyboard/mouse USB link; 5) CD-ROM and floppy disk drive ("FDD") USB link; 6) 12 VDC power; and 7) miscellaneous control signals. These interfaces provide the ability to communicate to other components in the server blade system such as management modules, switch modules, the CD-ROM and the FDD. These interfaces are duplicated on the midplane to provide redundancy. A server blade typically supports booting from the media tray CDROM or FDD, the network (Fibre channel or Ethernet), or its local hard disk drive.

A media tray MT includes a floppy disk drive and a CD-ROM drive that can be coupled to any one of the 14 blades. The media tray also houses an interface board on which is mounted interface LEDs, a thermistor for measuring inlet air temperature, and a 4-port USB controller hub. System level interface controls consist of power, location, over temperature, information, and general fault LEDs and a USB port. Each of the blades includes a handling system HS1–HS14 to allow for removal of the blade from the blade server system. The handling systems HS1 and HS4 are there to allow for the blade to be serviced or replaced as needed.

FIGS. 2A–2C illustrate a handling system HS1 for a blade in the blade server system. The handling system HS1 includes two handles 10 and 12 which each independently engage its own holding portion 14 and 16. The two handles 10 and 12 and holding portions 14 and 16 are attached to a chassis 18 which is coupled to the server blade (not shown).

FIG. 2A illustrates the handling system HS1 when handles are held by holding portions 14 and 16. FIG. 2B illustrates the handling system when the handles 10 and 12 have just been disengaged from the respective holding portions 14 and 16. Finally FIG. 2C illustrates the handling system HS1 when the handles are fully extended to allow for removal of the blades from the blade server system.

The problem with the standard handling system HS1 is that the two handle members are too large for the standard depth footprint required for each blade, in some applications such as when the blade server system is utilized for telecommunications equipment. There is a standard for telecommunications equipment in which the footprint is between 508 mm and 600 mm in length.

Accordingly, the protrusion of the handling system can extend beyond that length and therefore is not appropriate. What is desired is a way to provide a handling system that allows for easy removal of the blade but at the same time requires less space and fits within the desired footprint for telecommunications equipment for telecommunications applications. It should be understood that there are other areas where the footprint must be shorter also. This problem is not limited to telecommunications equipment.

Accordingly, a system should be easy to implement, cost-effective, and easy to use for removal of the chassis associated with the blade environment. The present invention addresses such a need.

SUMMARY OF THE INVENTION

A handling system for use with a blade is disclosed. The blade is within a computer system. The handling system comprises a chassis for holding the blade and a first handle member coupled to the chassis. The handling system includes a second handle member coupled to the chassis and being oppositely disposed to the first handle member. Finally, the handling system includes a latching mechanism which holds the first and second handle member in a retracted position when engaged therewith. The latching member when activated causes the first and second handle members to spring out to a point where the first and second handle members can be used to remove the chassis from the computer system.

A method and system in accordance with the present invention limits the handling system profile dimensionally by providing a spring-loaded latching mechanism for the handle members. In so doing, a blade server system is provided that has a smaller footprint than conventional server systems.

DETAILED DESCRIPTION

The present invention relates generally to server systems and more particularly to a handling system for use on blades within a server system. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A method and system in accordance with the present invention limits the handling system profile dimensionally by providing a spring-loaded latching mechanism for the handle members. In so doing, a blade server system is provided that has a smaller footprint than conventional server systems. To describe the features of the present invention in more detail refer now to the following description in conjunction with the accompanying figures.

FIGS. 3A–3D illustrate a handling system 100 for a blade in accordance with the present invention. The handling system 100 includes a first and second handle members 102a–102b. The handle members 102a–102b are engagedly coupled to the chassis The handle members 102a and 102b and latching mechanism 104 are coupled to the chassis 101. The chassis 101 holds the blade (not shown).

Figure 1:
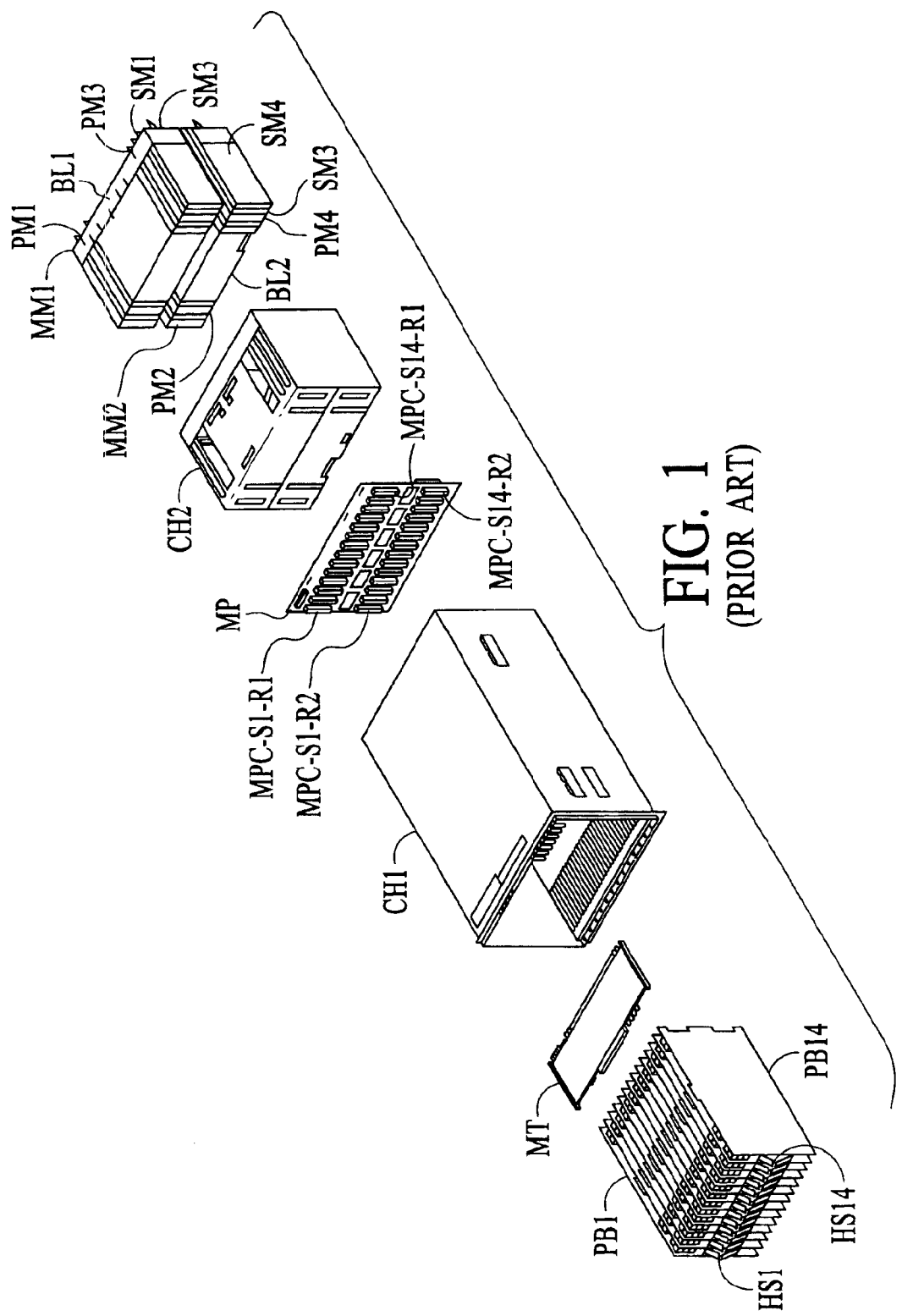
FIG. 1 is a front, top and right side exploded perspective view of a server blade system of the present invention.
Figure 2A:
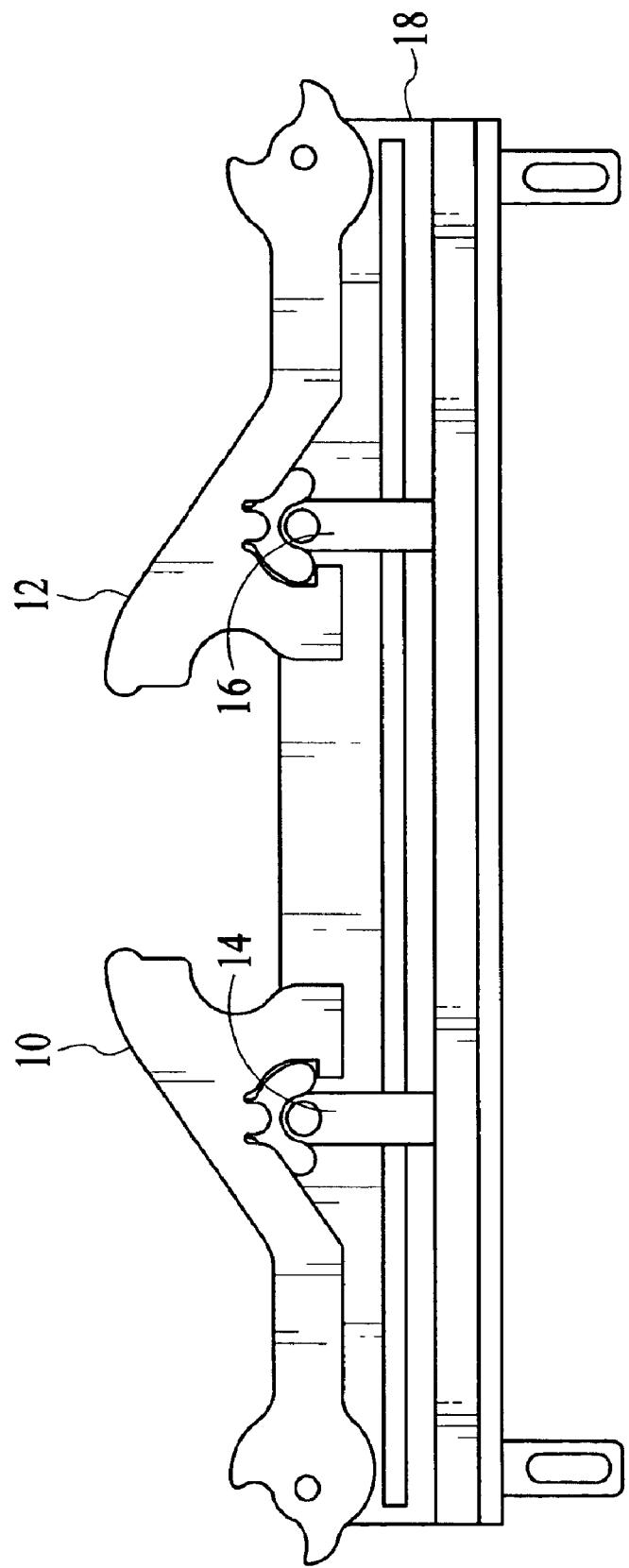
FIG. 2A illustrates the handling system when handles are held by holding portions.
Figure 2B:
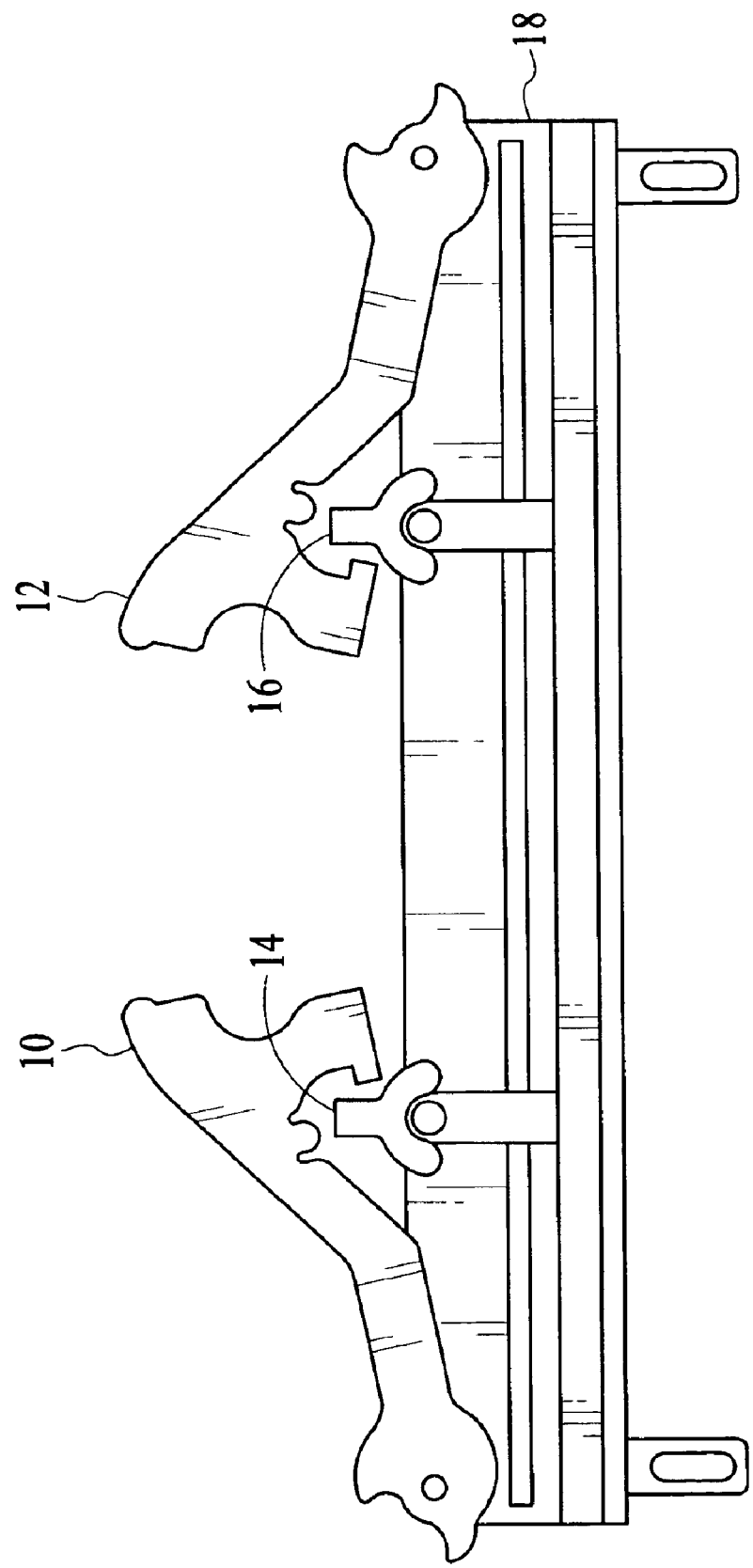
FIG. 2B illustrates the handling system when the handles have just been disengaged from the respective holding portions.
Figure 2C:
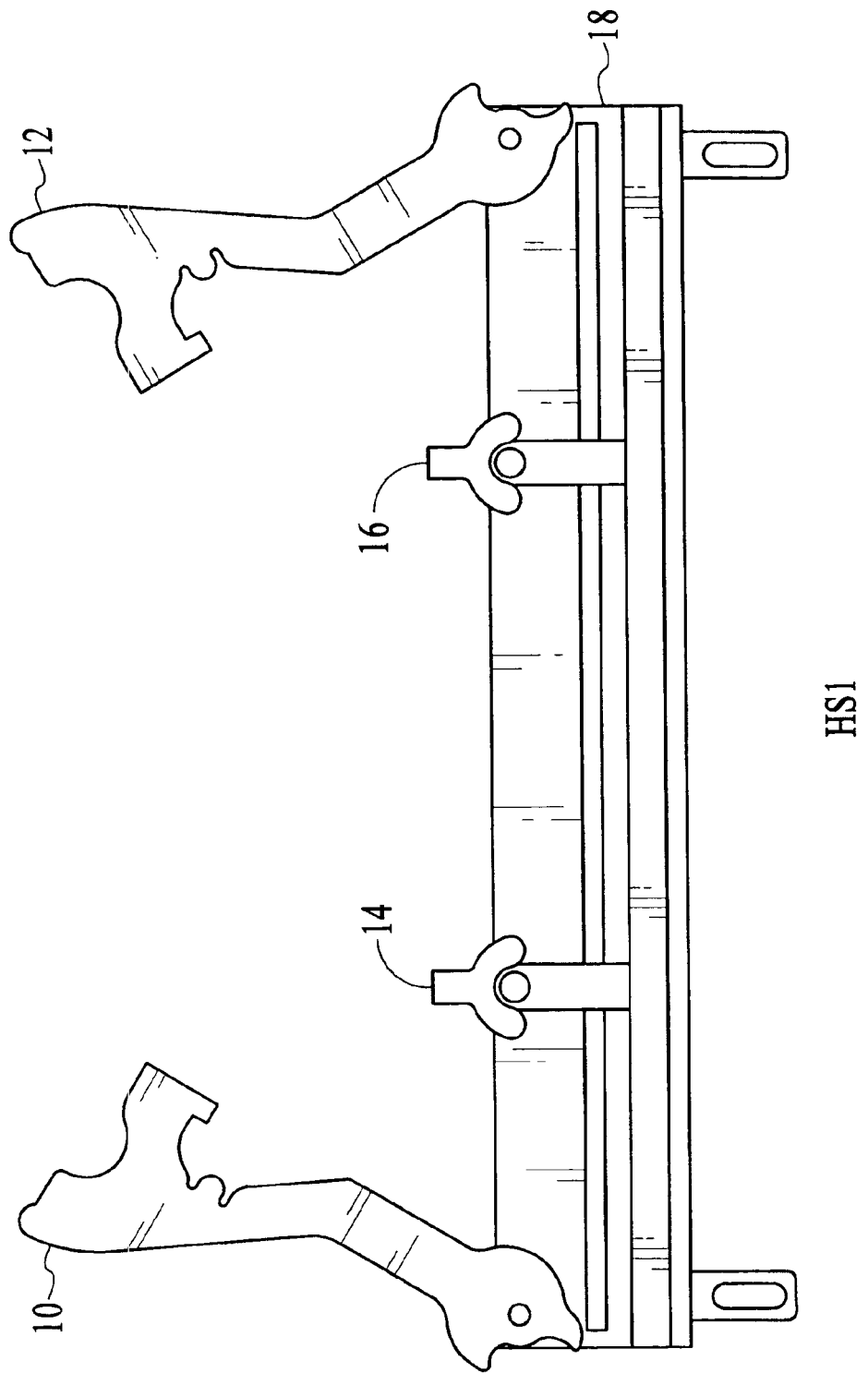
FIG. 2C illustrates the handling system when the handles are fully extended to allow for removal of the blades from the blade server system.
Figure 3A:
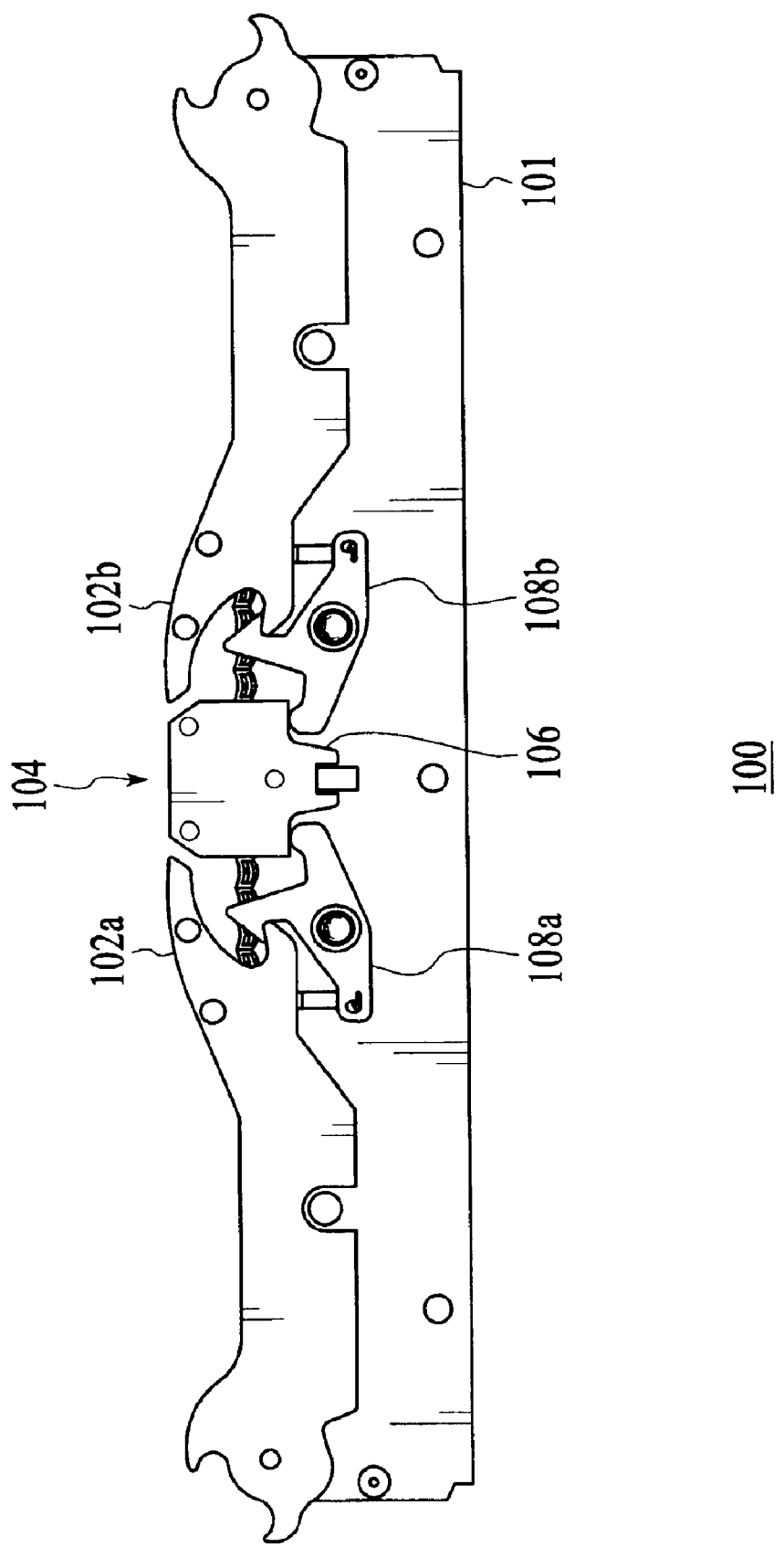
FIG. 3A illustrates the handling system for a blade.

The latching mechanism 104 comprises an actuator button 106 and two cam members 108a and 108b oppositely disposed of each other. FIG. 3A illustrates the handling system 100 when the latching mechanism 104 engages the handle members 102a and 102b. As is seen, the cam members 108a and 108b are engagedly coupled to the handles 102a and 102b respectively. As is seen in this embodiment, the design profile of the handle members is much lower than that shown in FIGS. 2A–2C, thereby allowing the handling system 100 to conform to the specified footprint.

Figure 3B:
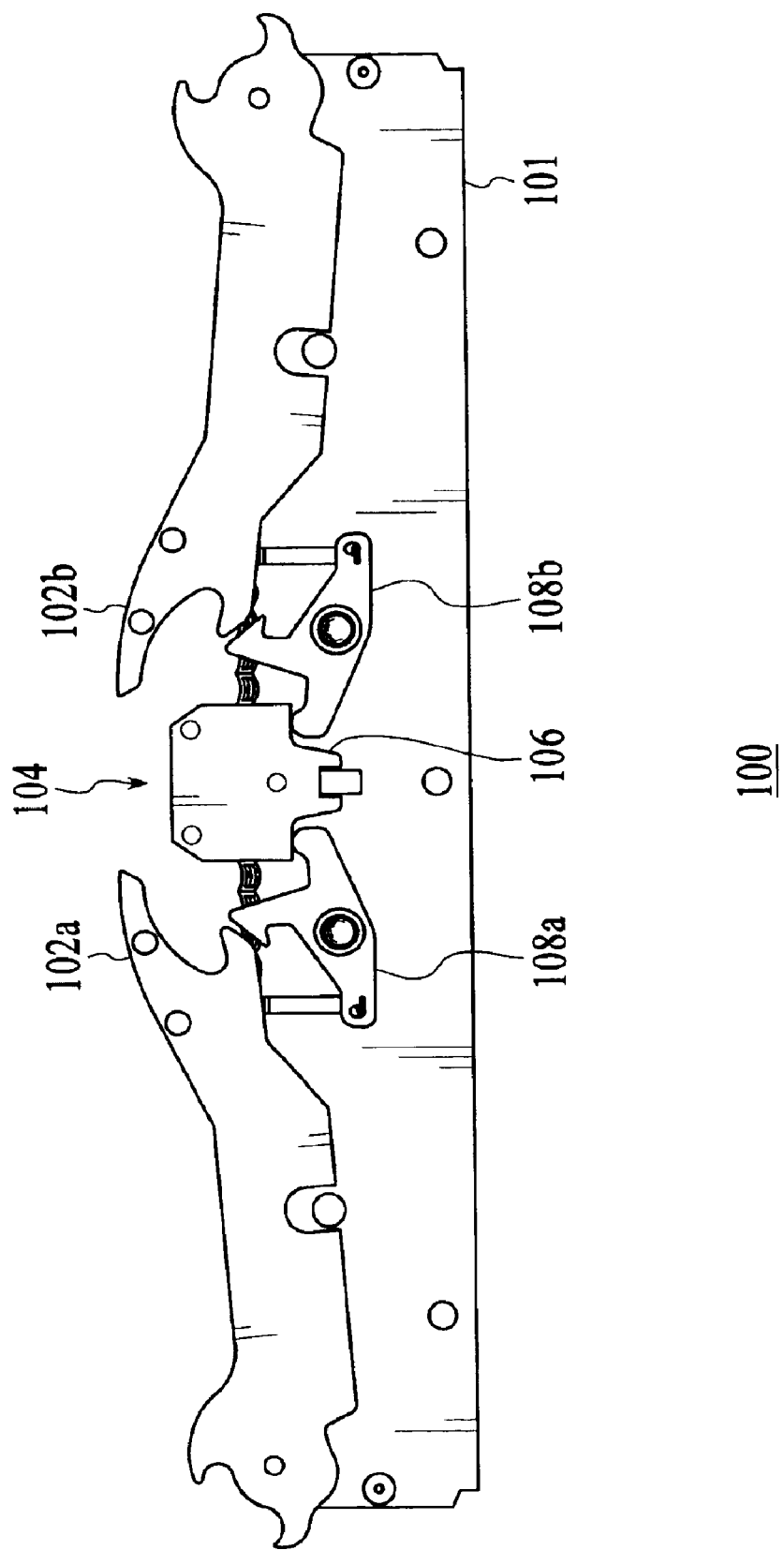
FIG. 3B illustrates the handling system after the mechanism is just depressed.

FIG. 3B illustrates the handling system after the actuator button is just depressed. As is seen, when the button 106 is depressed the cam members 108a and 108b disengage from each of the handle members 102a and 102b, thereby allowing the handle members 102a and 102b to spring out. The handle members 102a and 102b spring out, since each is spring actuated, via the cam members 108a and 108b. In so doing, the handle members 102a and 102b spring out far enough so that they can be easily handled by a user and thereby allowing for the removal of the chassis along with its blade from the server system.

Figure 3C:
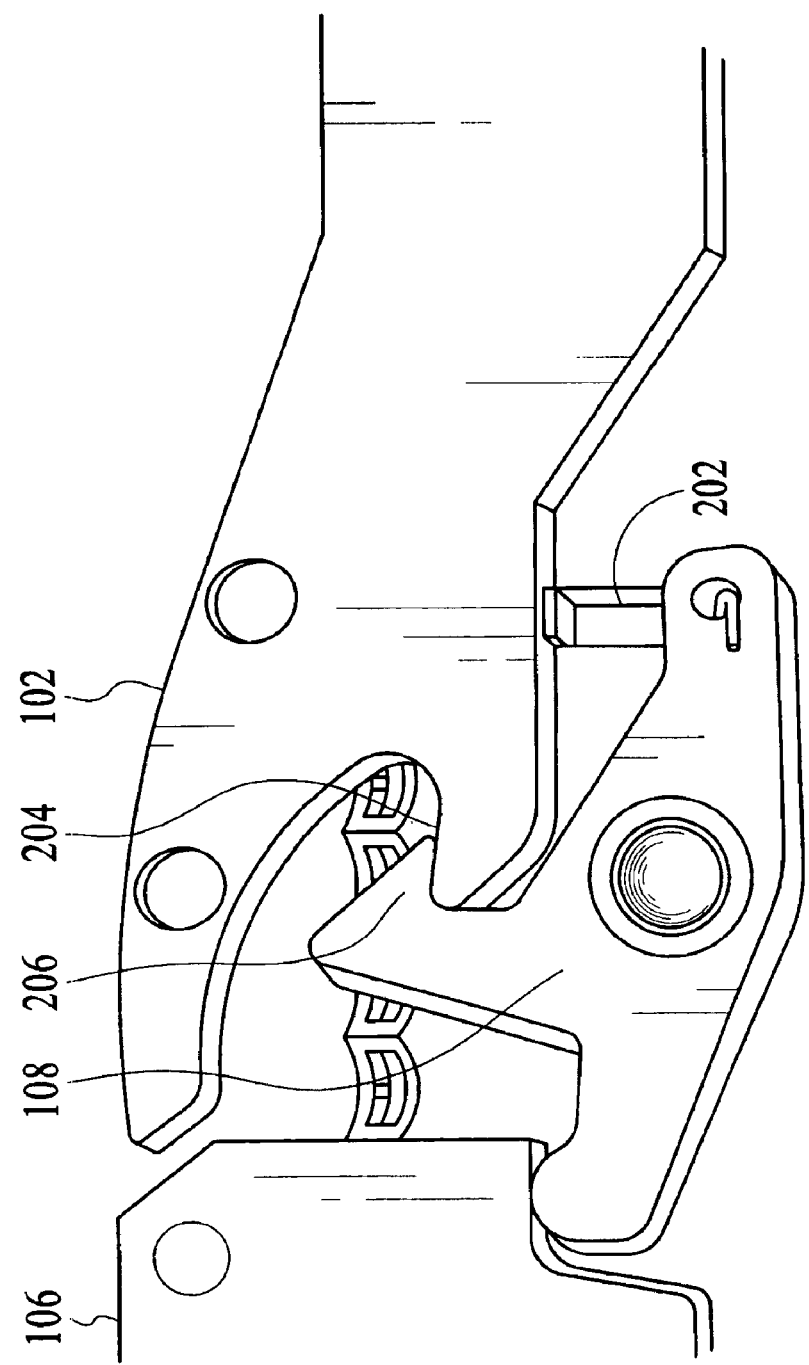
FIG. 3C is a detailed view of the spring loaded feature for each of the cam members.

FIG. 3C is a detailed view of the spring loaded feature for each of the cam members. As is seen, a spring 202 associated with the cam member 108 engages the handle member 102 to cause the handle member 102 to spring upward when the actuator button 106 is depressed. It is also seen that the lip 204 of the handle member 202 engages a lip 206 of the actual cam member 108 to engage the handle member.

Figure 3D:
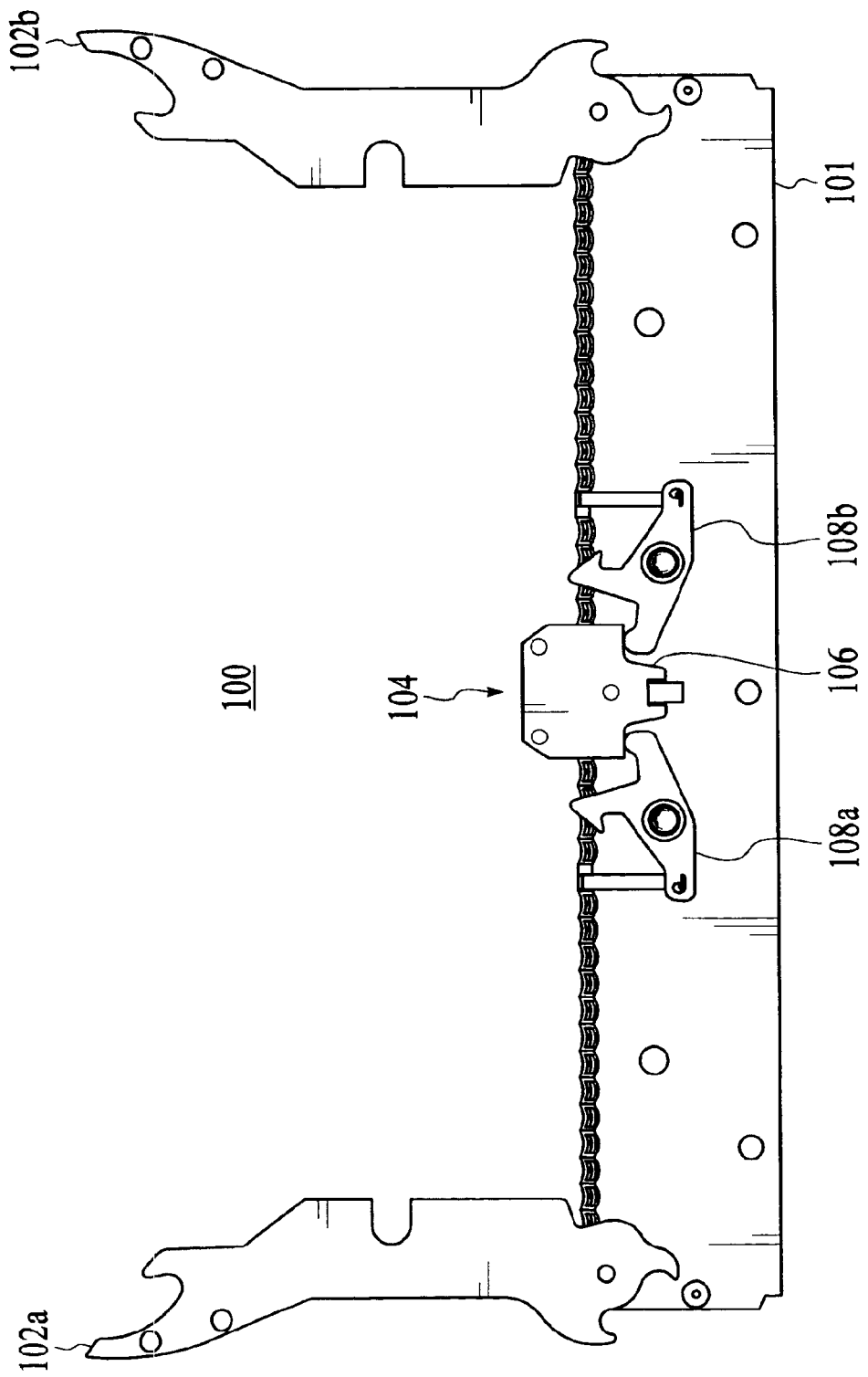
FIG. 3D illustrates the handling system when the handles are fully extended to allow for removal of the blades from the blade server system.

FIG. 3D illustrates the handling system 100 when the handle members 102a and 102b are fully extended to allow for removal of the blades from the blade server system.

A method and system in accordance with the present invention limits the handling system profile dimensionally by providing a spring-loaded latching mechanism for the handle members. In so doing, a blade server system is provided that has a smaller footprint than conventional server systems.

Although the present invention has been described in accordance with the embodiments shown, one of ordinary skill in the art will readily recognize that there could be variations to the embodiments and those variations would be within the spirit and scope of the present invention. For example, although the present invention has been described with respect to the eServer BladeCenter system one of ordinary skill in the art recognizes that the handling system could be used in a variety of environments and that use would be within the spirit and scope of the present invention. Accordingly, many modifications may be made by one of ordinary skill in the art without departing from the spirit and scope of the appended claims.

What is claimed is:

1. A handling system for use with a blade, the blade being within a server system, the handling system comprising:

a chassis for holding the blade;

a first handle member coupled to the chassis;

a second handle member coupled to the chassis and being oppositely disposed to the first handle member; and a latching mechanism which holds the first and second handle member in a retracted position when engaged therewith, wherein the latching mechanism comprises an actuator button, which when depressed, causes the first and second handle members to spring out to a point where the first and second handle members can be used to remove the chassis from the server system.

2. The handling system of claim 1 wherein the latching mechanism is spring loaded.

3. The handling system of claim 1 wherein the latching mechanism further comprises:

a first cam member engageably coupled to the actuator button;

a second cam member engageably coupled to the actuator button and oppositely disposed to the first cam member, the first cam member holding the first handle member in a retracted position and the second cam member holding the second handle member in a refracted position when the actuator button is engaged with the first and second cam members.

4. The handling system of claim 3 wherein each of the first and second cam members is spring loaded.

5. The handling system of claim 4 wherein the handle members can be conformed to a specified dimensional footprint when in a retracted position.

6. The handling system of claim 1 where the first and second handle members can be latched simultaneously.

7. The handling system of claim 1 wherein the first and second handle members can be latched independently.

8. The handling system of claim 4 wherein a spring is coupled to each handle member, wherein each spring acts to spring the handle member out as well as spring-load the latching mechanism.

9. A server system comprising:

a first chassis; and a plurality of servers located within the first chassis; each of the plurality of servers including a handling system coupled thereto; the handling system comprising a second chassis for holding a blade; a first handle member coupled to the second chassis; a second handle member coupled to the second chassis and being oppositely disposed to the first handle member; and a latching mechanism which holds the first and second handle member in a retracted position when engaged therewith, wherein the latching mechanism comprises an actuator button, which when depressed, causes the first and second handle members to spring out to a point where the first and second handle members can be used to remove the second chassis from the first chassis.

10. The server system of claim 9 wherein the latching mechanism is spring loaded.

11. The server system of claim 9 wherein the latching mechanism further comprises:

a first cam member engageably coupled to the actuator button;

a second cam member engageably coupled to the actuator button and oppositely disposed to the first cam member, the first cam member holding the first handle member in a retracted position and the second cam member holding the second handle member in a retracted position when the actuator button is engaged with the first and second cam members.

12. The server system of claim 11 wherein each of the first and second cam members is spring loaded.

13. The server system of claim 12 wherein the handle members can be conformed to a specified dimensional footprint when in a retracted position.

14. The server system of claim 9 where the first and second handle members can be latched simultaneously.

15. The server system of claim 9 wherein the first and second handle members can be latched independently.

16. The server system of claim 12 wherein a spring is coupled to each handle member, wherein each spring acts to spring the handle member out as well as spring-load the latching mechanism.

* * * * *